US006388202B1

(12) United States Patent
Swirbel et al.

(10) Patent No.: US 6,388,202 B1
(45) Date of Patent: May 14, 2002

(54) MULTI LAYER PRINTED CIRCUIT BOARD

(75) Inventors: Thomas J. Swirbel, Davie; John K. Arledge, Ft. Lauderdale; Joaquin Barreto, Coral Springs, all of FL (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 08/944,192

(22) Filed: Oct. 6, 1997

(51) Int. Cl.⁷ .................................................. H01R 9/09
(52) U.S. Cl. ........................ 174/261; 174/262; 361/792
(58) Field of Search .......................... 174/255, 261, 174/262, 265, 266; 361/784, 792, 795

(56) References Cited

U.S. PATENT DOCUMENTS

| 4,668,332 A | * | 5/1987 | Ohnuki et al. ............ 174/262 X |
| 5,451,721 A | | 9/1995 | Tsukada et al. .............. 174/261 |
| 5,487,218 A | * | 1/1996 | Bhatt et al. ............. 174/262 X |

FOREIGN PATENT DOCUMENTS

JP          8-8541   *   1/1996

* cited by examiner

Primary Examiner—Albert W. Paladini
(74) Attorney, Agent, or Firm—Dale W. Dorinski; Scott M. Garrett

(57) ABSTRACT

A high density multi-layer printed circuit board (100) is formed by building additional dielectric and metallization layers over a central core (110) of conventional PCB laminate construction. The central core has a metallization pattern (113, 114) on at least one surface. A photoimaged dielectric layer (130) is deposited on one side of the central core and overlies the metallization pattern. Vias (136) are formed in this dielectric layer by a photoimaging process, and an additional metallization pattern (133) on this layer is electrically connected to the underlying metallization pattern through these vias. A non-photoimageable dielectric layer (120) is deposited on the other side of the central core. Vias (126) are formed in this dielectric layer by a laser drilling process, and an additional metallization pattern (123) on this layer is electrically connected to an underlying metallization pattern through these laser drilled vias.

16 Claims, 2 Drawing Sheets

MULTI LAYER PRINTED CIRCUIT BOARD

TECHNICAL FIELD

This invention relates in general to printed circuit boards, and in particular to high density multi-layer printed circuit boards.

BACKGROUND

Historically, multi-layer printed circuit boards have been fabricated by laminating sequential layers of dielectric material and forming circuit patterns on each layer. The various layers of circuitry are interconnected by mechanically drilling holes and plating. This technology has run into the limitation of cost and size, as it is very difficult and expensive to drill a hole much smaller than about 0.25 mm. A new technology known as High Density Interconnect (HDI) technology circumvents this problem by using alternative methods to form the holes connecting the various layers. HDI technologies are lumped into three major categories based on the method used to form the holes (vias)—(1) plasma via, (2) laser via, and (3) photo via. Each of the technologies has certain advantages and disadvantages. For example, with plasma via technology the capability exists to use a variety of materials, such as epoxy or polyimide, as the dielectric layer. However, the via size that is capable of being formed is large and limited to holes greater than 0.15 mm to 0.20 mm. Laser via technology also employs a variety of dielectric materials such as epoxy, polyimide, polyfluorocarbons, aramid, etc., thus enabling the selection of a dielectric material with various electronic properties such as low loss factor and low or high dielectric constant. Additional benefits of laser processing are small via sizes (0.05 mm) and dielectric thickness up to 0.1 mm is possible. However, laser processing is not the most economical method to fabricate circuits, because, as in mechanical drilling, the vias are formed individually, there is a high cost associated with producing large quantities of vias. Forming vias by laser drilling is a single sided process, so when vias are needed on opposite sides of the printed circuit board there is a significant cost adder. Photo via technology is capable of producing very small vias (<0.05 mm) and since all the vias are formed simultaneously, it is the most cost effective. However, the choice of dielectric materials is limited, and the dielectric thickness is limited to a maximum of approximately 0.05 mm. This can be a problem for providing adequate isolation between adjacent layers for certain radio frequency (RF) and high speed digital applications. Printed circuit boards which are used in wireless communications equipment carry circuitry used for both RF and high speed digital signals and also for logic, microprocessor, and other controller-type functions. However, the requirements for the circuitry associated with each is different. Microprocessor applications require high density interconnections on the circuit board, and a photo via technology works best here because it provides the highest interconnection capability for the lowest price. Also, the limitations of the dielectric material do not negatively impact performance. On the other hand, RF type circuitry for voltage controlled oscillators, synthesizers, etc. does not require high density circuitry for interconnection but does require precisely controlled impedance matching for critical signal paths.

To meet these requirements and to provide the size reduction which conventional multi-layer lamination/drilling technology is not capable of, laser vias work best. The laser via process enables utilization of materials which have optimal electrical performance and the added thickness enables a significant increase in layer to layer electrical isolation. However, the laser processing needed to produce the small via size has the penalty of increased cost. Clearly, an improvement in the art is needed to overcome these various disadvantages.

DETAILED DESCRIPTION OF THE PREFERRED EMBODIMENT

A high density multi-layer printed circuit board is formed by building additional dielectric and metallization layers over a central core of conventional PCB laminate construction. The central core has a metallization pattern on at least one surface. A photoimaged dielectric layer is deposited on one side of the central core and overlies the metallization pattern. Vias are formed in this dielectric layer by a photo-imaging process, and an additional metallization pattern on this layer is electrically connected to the underlying metallization pattern through these vias. A non-photoimageable dielectric layer is deposited on the other side of the central core. Vias are formed in this dielectric layer by a laser drilling process, and an additional metallization pattern on this layer is electrically connected to an underlying metallization pattern through these laser drilled vias.

Figure 1:
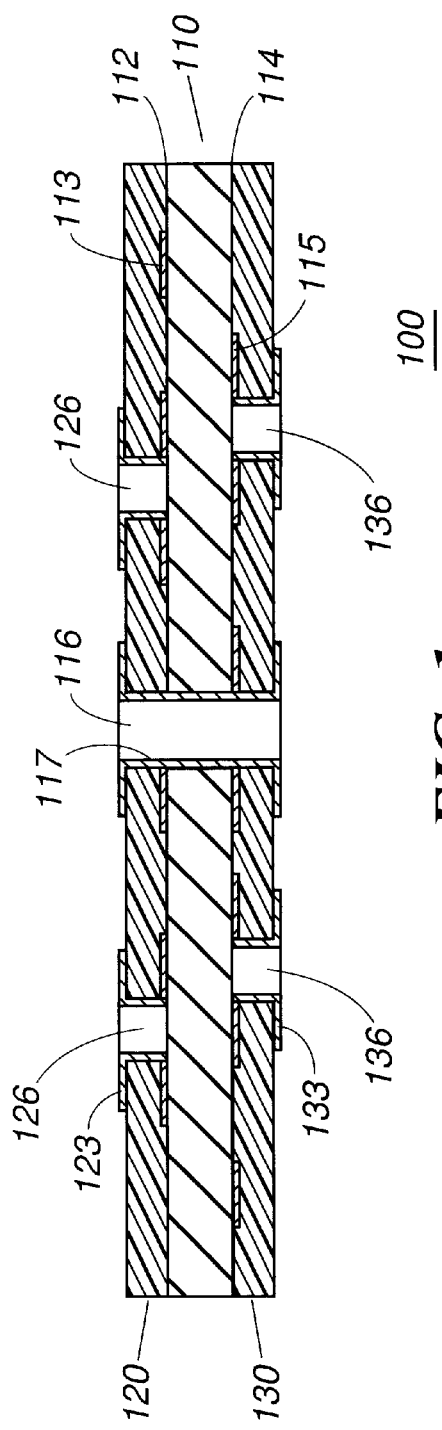
FIG. 1 is a cross-sectional view of a high density multi-layer printed circuit board in accordance with the invention.

Referring now to FIG. 1, a high density multi-layer printed circuit board (PCB) 100 is constructed around a central core substrate 110. This core substrate is a conventional PCB construction, typically a laminate composed of a polymer (epoxy, polyimide, TEFLON or polyester, for example) reinforced with woven glass mat, or a polymer reinforced with chopped glass fibers (in the case of materials like EM-3 or EM-4). One or both sides (opposing major surfaces) 112, 114 of the central core substrate 110 have a metallization pattern 113, 115 that consists of circuit traces or runners, typically etched from a copper sheet that has been clad to the laminate. An alternate method of creating the metallization pattern is by building up the circuit traces by additive plating. These techniques of creating a double sided printed circuit board are well known to those skilled in the art, and one will appreciate that alternate constructions and methods (for example, thin film deposition, screen printing, etc.) couldeasily be substituted for the above in order to create the double sided PCB. These metallization patterns 113, 115 will ultimately be the inner circuit traces of the multi-layer PCB. In addition, although the preferred embodiment contains metallization patterns on both sides of the PCB (a double sided PCB), a multi-layer PCB can also be created where the central core only has a metallization pattern on one side, i.e. a single sided PCB. Optionally, the central core substrate 110 may contain a hole 116 drilled completely through the substrate to provide electrical connection between the two metallization patterns 113, 115 on the double sided PCB. The electrical connection is achieved by metallizing the walls 117 of the hole 116 to make the well known 'plated-through hole' (PTH), or the hole can be filled with conductive epoxy.

After the metallization patterns 113, 115 are formed, a resin coated copper foil, such as Polyclad PCL-CF-400 laminate, is pressed and cured to one side of the central core substrate 110. This resin coated copper foil contains a dielectric layer 120 and a layer of metal (typically copper, but other metals such as aluminum, nickel or chromium could also be used) that will ultimately be etched and patterned to form the circuit traces in the metallization pattern 123. Alternate resins such as SPEEDBOARD (a polyfluorocarbon resin from W.L. Gore, Inc.) which has a low loss factor (0.008) and low dielectric constant (2.7), liquid crystal polymers, or aramid resins can also be used with efficacy. The resin coated copper foil is adhered to the central core substrate 110 by heat and pressure, and vias 126 in the dielectric layer 120 are formed using an ultraviolet (UV) laser. The UV laser has the capability of penetrating through the thin copper foil to remove selected portions of the dielectric layer 120. Alternatively, if one were to add a dielectric layer 120 that did not have a metal foil coating, a $CO_2$ laser could be used to drill the via holes. This type of laser is well known to penetrate organic material such as polymers, but will not penetrate a metal barrier. When using a $CO_2$ laser, precise control of the strength of the laser beam is not necessary, as the underlying metallization pattern 113 essentially stops the laser from penetrating the central core substrate 110.

Next, a second dielectric layer 13 of a photoimageable resin (PROBIMER, by Ciba-Geigy, for example) is coated on the second side 114 of the central core substrate 110 and imaged to form interconnect vias 136 to the underlying metallization pattern 15. Rather than forming these vias 136 by a laser, they are formed by photolithographic process that photoimages all the vias at once. Forming vias or openings in a photoimageable resin using a photolithographic process is well to known to those of ordinary skill in the art. In one version using a positive acting photoresist, a patterned photomask is used to cover portions of the photoimageable resin 130, and the other portions (the vias) are exposed to light. The light causes photoinitiators in the polymer to break down the polymer, thus making it soluble in a developer solution. When the mask is removed and the photopolymer is developed, those areas exposed to light (the via locations) have been removed from the polymer. We find, however, that a negative acting photoresist is the preferred method of forming the vias. When using this type of resist, the process is nearly the same, except that the photomask is the negative image of that used in the positive process, and those portions the resist that are exposed to light react to further polymerize, making them less soluble to the developer. When the mask is removed and the photopolymer is developed, those areas not exposed to light (the via locations) have been selectively dissolved from the cured polymer resist film. In either case, the photolithographic process is capable of forming thousands of vias simultaneously, as opposed to the serial process of forming them one at a time with a laser beam. It should be obvious to the reader that the instant invention provides the heretofore unrealized advantage of combining the speed of photoimaging vias with the ability to select from a much wider variety of resins because of the use of the laser process. Only a few special materials are capable of being photoimaged, and most of these tend to be acrylic based chemistries that have a relatively narrow range of electrical properties. On the other hand, the use of laser drilled vias allows one to select from a much broader variety of resins and polymers, thus providing a wider selection of electrical properties. This is particularly useful when one wishes to combine digital and radio frequency (RF) signals on the same PCB. Digital signals tend to be rather forgiving of the electrical properties of the substrate upon which they are routed. However, the selection of substrate materials when using RF signals is much more critical, and factors such as loss tangent and dielectric constant of the polymer are extremely important. Prior art constructions have required that the designer who wishes to utilize a material such as a polyfluorocarbon resin in a high density multi-layer PCB is forced to mechanically or laser drill the vias one at a time, even if the other side of the PCB were only handling digital signals. Our invention brings the best of both worlds together, providing quality RF signal transmission with high speed, low cost processing of one portion of the PCB by using photoimaging.

After processing, a metallization pattern 133 is formed on the second photoimageable layer 130 by plating with electroless copper or by vacuum metallizing a seed layer and subsequently electroplating to form the circuit traces. At this time, the walls of the laser drilled vias 126 are also metallized. In so doing, the walls of the vias 126, 136 are coated with conductive metal to electrically connect the metallization patterns 123, 133 to the underlying respective metallization patterns 113, 115 on the central core substrate 110.

If interconnection from front to back, i.e. from the third metallization pattern 123 to the fourth metallization pattern 133, is required, through board vias 116 are mechanically drilled using conventional techniques. It should be obvious to the reader that electrical connection can also be made to the inner metallization patterns 113, 115 of the central core substrate through the mechanically drilled via 116. If this hole 116 is drilled prior to the addition of the resin coated copper dielectric layer 120, portion of the dielectric layer 120 will flow into the hole 116 during cure and at least partially fill or plug the hole. The designer can use this phenomena to advantage.

Figure 2:
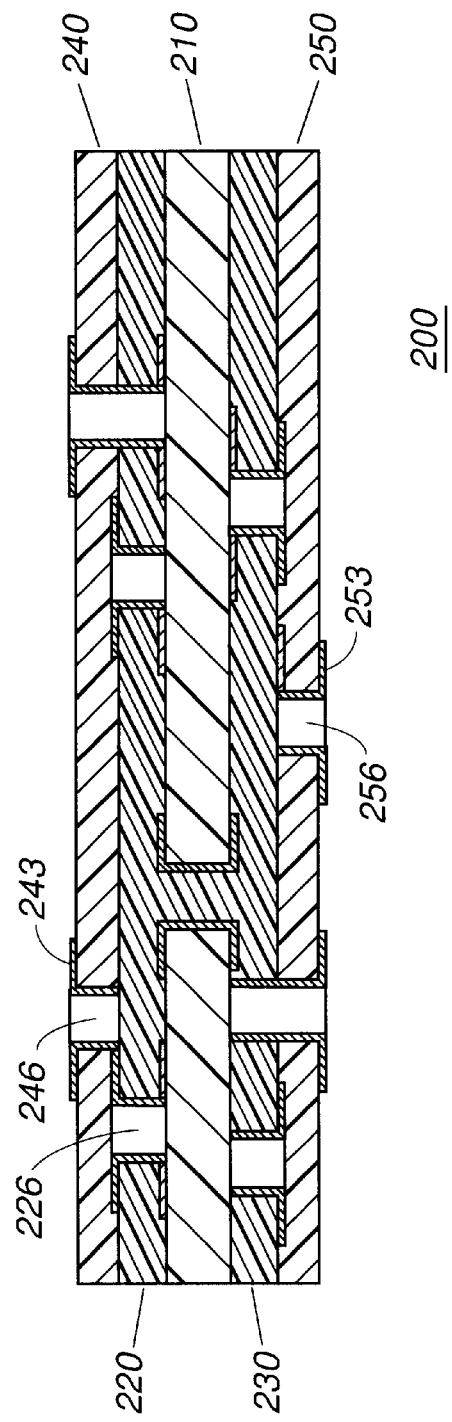
FIG. 2 is a cross-sectional view of an additional embodiment of a multi-layer printed circuit board in accordance with the invention.

A cross-section of an alternate embodiment of the invention is shown in FIG. 2. Additional multiple layers of dielectric 240, 250 can be built up on one or both sides, and if desired, in another embodiment of the invention, the technologies (laser drilling and photoimaging) can be mixed on a single side. That is, a laser drilled dielectric layer can be combined with a photoimaged dielectric layer (in any order of combination), or two laser drilled layers can be combined or two photoimageable layers can be combined to form a multi-layer PCB with 5 or more layers. Obviously, this provides even more flexibility to the designer, and lowers the cost of the overall product significantly.

Figure 3:
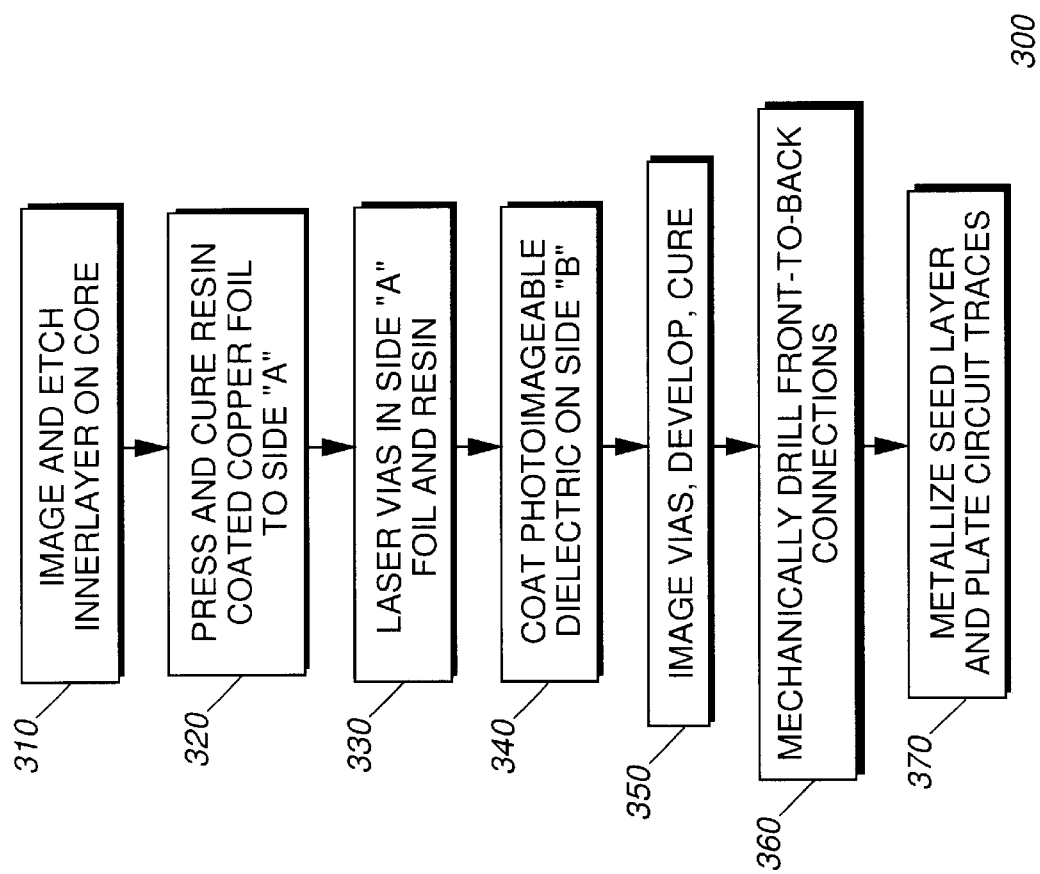
FIG. 3 is a flow chart of one process that is used to fabricate a multi-layer printed circuit board in accordance with the invention.

One example of a process flow for manufacturing such a board is shown in FIG. 3. Inner layer circuit traces are imaged and etched on the core substrate (310). Resin coated copper foil is attached to side "A" of the core substrate by pressure and heat (320). Vias are formed in the resin coated copper layer by means of laser 330). A photoimageable dielectric layer is coated on the "B" side of ecore substrate (340), and the vias are then all simultaneously photoimaged in the dielectric layer, developed and cured (350). If desired, front to back connection is made by mechanical drilling completely through the built up PCB (360). The structure is metallized and plated up to create electrical connection in the via holes and to form the metallization pattern on the photoimaged dielectric layer (370).

In summary, the invention provides a multi-layer printed circuit board that is constructed using a combination of laser and photo via processes. Multiple layers of build up can be combined on each side, and if desired, the technologies can be mixed on a side. The current industry approach is to use either process, but not to combine the two. Our novel PCB construction is the result of a heretofore unknown combination of proven laser and photo via processing technologies to manufacture high density interconnect (HDI) printed circuit boards. The unique and stringent requirements for combining digital and RF products enable this construction to be advantageous from cost and performance standpoints. While the preferred embodiments of the invention have been illustrated and described, it will be clear that the invention is not so limited, and other equivalents will occur to those skilled in the art without departing from the spirit and scope of the present invention as defined by the appended claims.

What is claimed is:

1. A multi-layer printed circuit board, comprising:
    a central core substrate having first and second major opposing surfaces containing first and second respective metallization patterns;
    a photoimaged dielectric layer deposited on the first surface and overlying the first metallization pattern, said photoimaged dielectric layer containing a third metallization pattern and photoimaged vias that electrically connect the third metallization pattern to the underlying first metallization pattern; and
    a non-photoimageable dielectric layer deposited on the second surface and overlying the second metallization pattern, said non-photoimageable dielectric layer containing a fourth metallization pattern and laser-formed vias that electrically connect the fourth metallization pattern to the underlying second metallization pattern.

2. The multi-layer printed circuit board as described in claim 1, further comprising a second photoimaged dielectric layer containing a fifth metallization pattern and photoimaged vias that electrically connect to an underlying metallization pattern.

3. The multi-layer printed circuit board as described in claim 2, wherein the second photoimaged dielectric layer is deposited over the photoimaged dielectric layer that contains the third metallization pattern.

4. The multi-layer printed circuit board as described in claim 2, wherein the second photoimaged dielectric layer is deposited over the non-photoimageable dielectric layer that contains the fourth metallization pattern.

5. The multi-layer printed circuit board as described in claim 2, further comprising a second non-photoimageable dielectric layer containing a sixth metallization pattern and laser-formed vias that electrically connect to an underlying metallization pattern.

6. The multi-layer printed circuit board as described in claim 1, further comprising a second non-photoimageable dielectric layer containing a fifth metallization pattern and laser-formed vias that electrically connect to an underlying metallization pattern.

7. The multi-layer printed circuit board as described in claim 6, wherein the second non-photoimageable dielectric layer is deposited over the photoimaged dielectric layer that contains the third metallization pattern.

8. The multi-layer printed circuit board as described in claim 6, wherein the second non-photoimageable dielectric layer is deposited over the non-photoimageable dielectric layer that contains the fourth metallization pattern.

9. The multi-layer printed circuit board as described in claim 6, wherein the laser-formed vias in the second non-photoimageable dielectric layer extend to two underlying metallization patterns.

10. The multi-layer printed circuit board as described in claim 1, wherein the central core is a glass reinforced laminate.

11. The multi-layer printed circuit board as described in claim 1, further comprising a hole drilled through the central core that electrically connects the first or second metallization pattern to the third or fourth metallization patterns.

12. The multi-layer printed circuit board as described in claim 11, wherein the hole is a plated through hole.

13. The multi-layer printed circuit board as described in claim 11, wherein the hole is filled with conductive epoxy.

14. The multi-layer printed circuit board as described in claim 11, wherein the hole is filled with portions of the non-photoimageable dielectric layer.

15. A multi-layer printed circuit board, comprising:
    a central core substrate having first and second major opposing surfaces, one of the surfaces containing a first metallization pattern;
    a photoimaged dielectric layer deposited on the first surface, said photoimaged dielectric layer containing a second metallization pattern and photoimaged vias that electrically connect the second metallization pattern to the underlying first metallization pattern;
    a non-photoimageable dielectric layer deposited on the second surface and containing a third metallization pattern, and vias that electrically connect the third metallization pattern to the first metallization pattern.

16. A multi-layer printed circuit board comprising:
    a photoimaged dielectric layer on one side of a central core substrate and a non-photoimaged dielectric layer on an opposite side of the central core substrate, the photoimaged dielectric layer containing electrically conductive vias that are formed by a photolithographic process and the non-photoimaged dielectric layer containing electrically conductive vias that are formed by a laser.

* * * * *